(12) United States Patent
Uchida

(10) Patent No.: US 6,531,363 B2
(45) Date of Patent: *Mar. 11, 2003

(54) METHOD FOR MANUFACTURING A SEMICONDUCTOR INTEGRATED CIRCUIT OF TRIPLE WELL STRUCTURE

(75) Inventor: Tetsuya Uchida, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/262,849

(22) Filed: Mar. 5, 1999

(65) Prior Publication Data

US 2002/0031882 A1 Mar. 14, 2002

(30) Foreign Application Priority Data

Mar. 5, 1998 (JP) ............................................. 10-053912

(51) Int. Cl.[7] .......................................... H01L 21/8234
(52) U.S. Cl. ....................... 438/275; 438/258; 438/241; 438/526
(58) Field of Search ................................ 438/258, 241, 438/275, FOR 490, FOR 205, FOR 212, FOR 160, 526; 257/500, 326, 296, 391

(56) References Cited

U.S. PATENT DOCUMENTS

| | | | |
|---|---|---|---|
| 5,668,755 A | | 9/1997 | Hidaka |
| 5,693,505 A | | 12/1997 | Kobayashi |
| 5,989,962 A | * | 11/1999 | Holloway et al. |
| 6,022,778 A | * | 2/2000 | Contiero et al. |
| 6,043,128 A | * | 3/2000 | Kamiya |
| 6,097,078 A | * | 8/2000 | Sim et al. |

FOREIGN PATENT DOCUMENTS

| | | | |
|---|---|---|---|
| JP | 4-61269 | | 2/1992 |
| JP | 4-92466 | | 3/1992 |
| JP | 5-211232 | * | 8/1993 |
| JP | 6-151731 | | 5/1994 |
| JP | 6-224215 | * | 8/1994 |
| JP | 7-183393 | | 7/1995 |
| JP | 8-204025 | | 8/1996 |
| JP | 8330439 A | * | 12/1996 |
| JP | 9-55483 | | 2/1997 |
| JP | 9-186244 | | 7/1997 |
| JP | 9223747 A | * | 8/1997 |
| JP | 2000133609 A | * | 5/2000 |

* cited by examiner

Primary Examiner—Olik Chaudhuri
Assistant Examiner—Michelle Estrada
(74) Attorney, Agent, or Firm—Sughrue Mion, PLLC

(57) ABSTRACT

There is disclosed a method for manufacturing a semiconductor integrated circuit of triple well structure, comprising the steps of forming an N-well, a P-well and a device isolation region in an N-type silicon substrate, thereafter forming a silicon oxide film on the whole surface of the silicon substrate by a thermal oxidation, forming a resist mask covering a region in which the silicon oxide film is required, ion-implanting a P-type impurity using the resist mask as a mask and with an implantation energy enough to allow the ion-implanted impurity to reach a bottom of the N-well and the P-well, so as to form a buried impurity layer, thereafter removing the silicon oxide film not covered with the resist mask by an etching, then removing the resist mask, and conducting a thermal oxidation on the whole surface of the silicon substrate so that a relatively thick gate oxide film is formed on a region which was covered with the resist mask, and a relatively thin gate oxide film is formed on a region which was not covered with the resist mask, and thereafter, forming a gate electrode and a source/drain diffused layer in a required well.

9 Claims, 18 Drawing Sheets

Tr1,Tr2 : DRIVER TRANSISTOR
Tr3,Tr4 : ACCESS TRANSISTOR
R1,R2 : HIGH RESISTANCE LOAD

METHOD FOR MANUFACTURING A SEMICONDUCTOR INTEGRATED CIRCUIT OF TRIPLE WELL STRUCTURE

BACKGROUND OF THE INVENTION

1. Field of the Invention

The present invention relates to a method for manufacturing a semiconductor integrated circuit of triple well structure.

2. Description of Related Art

In the prior art, a reduced power consumption is strongly demanded in a semiconductor integrated circuit such as DRAM and SRAM. One effective approach is to lower a power supply voltage. However, it is in many cases that an external power supply voltage Vext is fixed and therefore can be freely set. In many cases, therefore, the lowering of the power supply voltage is realized by maintaining the external power supply voltage Vext as it is but lowering only an internal power supply voltage Vint used in the inside of the semiconductor integrated circuit chip.

When two different power supply voltages of the external power supply voltage Vext and the internal power supply voltage Vint are used in the semiconductor integrated circuit of a CMOS structure, two kinds of N-wells become necessary. Namely, an N-well set to the external power supply voltage Vext and another N-well set to the internal power supply voltage Vint become necessary. A well structure capable of realizing this demand is exemplified by a well structure in which N-wells 103 and 105 are formed in a surface region of a P-type silicon substrate 101 as shown in FIG. 16.

However, when this well structure is adopted in the semiconductor integrated circuit such as DRAM and SRAM, a problem is encountered. Now, this problem will be described with reference to a DRAM as an example.

FIG. 17 is an equivalent circuit of a typical DRAM memory cell. In FIG. 17, the memory cell is constituted of one capacitor 150 and one NMOS transistor 151. A gate of the NMOS transistor 151 is connected to a word line 152, and one of a source and a drain of the NMOS transistor 151 is connected to a bit line 153. The other of the source and the drain of the NMOS transistor 151 is connected to the memory cell capacitor 150, Incidentally, a condition that an electric charge is accumulated in the memory cell capacitor 150, corresponds to a information holding condition.

In order to access the memory cell, a potential of the word line 152 is elevated so as to turn on the NMOS transistor 151. In this condition, information can be written into and read out from the memory cell capacitor 150 through the bit line 153. The above is an operation principle of the memory cell.

In the DRAM, a number of memory cells having the above mentioned structure are arranged in the form of a matrix array. These memory cell array is formed in a P-well. Incidentally, not only the memory cell array but also a peripheral circuit and an input/output circuit are formed in the DRAM.

When the DRAM is formed as shown in FIG. 16, all P-wells including a P-well 102 in which the memory cell array is formed, are electrically connected to one another through the substrate. As a result, the following problem is encountered.

Namely, a negative potential is applied to an input/output terminal, electrons are emitted to a P-well 104 from an $n^+$ diffused layer 108 connected to the input/output terminal, and these emitted electrons reach to the P-well 102 of a memory cell zone 113 through the substrate 101, and further enter to an $n^+$ diffused layer 110 within this well 102, thereby to resultantly cancel the electric charges of a memory cell capacitor 111 connected to the $n^+$ diffused layer 110.

Furthermore, electrical noises generated in a P-well of a peripheral circuit zone propagate to the P-well 102 of the memory cell zone 113. As a result, an adverse influence occurs that information of the memory cell cannot be properly read out.

In addition, since the potential of all the P-well must be made in common, it is impossible to set the potential of the P-well 102 of the memory cell zone 113 to a negative level in order to prevent a soft error and to elevate a breakdown voltage of the device isolation, and on the other hand to maintain the P-well of the peripheral circuit at a ground potential in order to prevent a latch-up phenomenon.

In order to prevent the above mentioned problem, for example, Japanese Patent Application Pre-examination Publication No. JP-A-09-055483 and its corresponding U.S. Pat. No. 5,668,755 (the content of which is incorporated by reference in its entirety into this application) propose a triple well structure. Now, this triple well structure will be described with reference to FIG. 18. As shown in FIG. 18, in an N type silicon substrate 121, a buried P-type layer 124 is formed in addition to N-wells 125 and 126 and P-wells 122 and 123. The N-well 125 is surrounded by the P-well 123 and the buried P-type layer 124 so that the N-well 125 is electrically isolated from the N type silicon substrate 121. An internal power supply voltage Vint is applied to the N-well 125 surrounded by the buried P-type layer 124, and an external power supply voltage Vext is applied to the N-well 126 which is not surrounded by the buried P-type layer 124. The P-wells 122 and 123 are electrically isolated from each other since the substrate is of the N type.

In this triple well structure, not only the two different wells of the N-well 125 set to the internal power supply voltage Vint and the N-well 126 set to the external power supply voltage Vext can be used, but also the P-wells are electrically isolated from each other. Therefore, even if a negative potential is applied to the input/output terminal so that electrons are emitted from an $n^+$ diffused layer connected to the input/output terminal, the electrons are absorbed by the N type silicon substrate 121, and therefore, the electrons do not reach the P-well 122 of a memory cell zone 113. Accordingly, even if a negative potential is applied to the input/output terminal, there is no fear that the information of the memory cell is erased.

Furthermore, since the P-well 122 of the memory cell zone 113 is electrically isolated from a P-well of a peripheral circuit zone by the N type silicon substrate 121, the electrical noises generated in the peripheral circuit zone never propagate to the memory cell zone 113, so that the information of the memory cell is never lost.

In addition, since the P-well 122 of the memory cell zone 113 is electrically isolated from P-wells of the peripheral circuit zone and an input/output circuit zone by the N type silicon substrate 121, it is possible to set the potential of the P-well of the memory cell zone 113 to a negative level in order to prevent a soft error and to elevate a breakdown voltage of the device isolation, and on the other hand to maintain the P-wells of the peripheral circuit zone and an input/output circuit zone at a ground potential in order to prevent a latch-up phenomenon.

Since the triple well structure has many advantages as mentioned above, this triple well structure is adopted in many DRAMs and many SRAMs.

On the other hand, not only the reduced power consumption but also a high speed operation are demanded in the semiconductor integrated circuit. For the high speed operation, it is required to increase an ON current of MOSFETs. One means for increasing the ON current is to thin a gate oxide film. However, if only the gate oxide film is thinned while maintaining the power supply voltage, an electric field applied to the gate oxide film becomes strong, with the result that reliability of the gate oxide film can no longer be ensured. Therefore, in order to thin the gate oxide film, it is necessary to lower the power supply voltage.

However, as mentioned hereinbefore, even if it is possible to lower the internal power supply voltage Vint used in the inside of the chip, it is impossible in many cases to arbitrarily lower the external power supply voltage Vext supplied from an external circuit, since the external power supply voltage Vext is previously set in accordance with a standard. In this case, the thickness of the gate oxide film must be set to be thick sufficiently to withstand the external power supply voltage Vext which is relatively high, with the result that the thick gate oxide film must be inevitably used in the internal circuit although the internal power supply voltage is relative low, and therefore, the ON current is small and the speedup of the operation speed is hindered.

Japanese Patent Application Pre-examination Publication No. JP-A09-186244 (an English abstract of JP-A-09-186244 is available and the content of the English abstract of JP-A-09-186244 is incorporated by reference in its entirety into this application) proposes one approach for overcoming the above problem. In this approach, two different gate oxide film thicknesses are used in one chip, so that the gate oxide film of MOSFETs in an input/output circuit zone applied with the external power supply voltage Vext is formed to have a thickness larger than that of the gate oxide film of MOSFETs in an internal circuit applied with the internal power supply voltage Vint. With this arrangement, only the thickness of the gate oxide film of the MOSFETs in the internal circuit can be thinned while maintaining the reliability of the gate oxide film of the MOSFETs in the input/output circuit zone, so that the ON current in the internal circuit can be increased.

A process for manufacturing this semiconductor integrated circuit will be described with reference to FIGS. 19A and 19B.

First, a silicon oxide film 141 is formed on the whole surface of a substrate by a thermal oxidation. Succeedingly, as shown in FIG. 19A, a resist mask 145 is formed to cover only an input/output circuit zone 140 by a photolithography, and then, the silicon oxide film 141 not covered with the resist mask 145 is selectively removed by an etching. Thereafter, the resist mask 145 is removed, and the whole surface is thermally oxidized again. As a result, as shown in FIG. 19B, a thin gate oxide film 144 is formed in an internal circuit zone 142, and a thick gate oxide film 143 is formed in the input/output circuit zone 140.

However, this approach has a problem that the number of steps in a manufacturing process increases.

Namely, if the gate oxide film thickness is uniform, it is sufficient if only one thermal oxidation is carried out for forming the gate oxide film. In this approach, however, for forming the thick gate oxide film 143, it is necessary to add the masking step after the first thermal oxidation, then to carry out the etching, and further to perform the second thermal oxidation. Accordingly, in the structure having the two different gate oxide film thicknesses, since the number of masking steps becomes increased, the cost becomes high.

Incidentally, in the prior art semiconductor integrated circuit such as DRAM and SRAM, even if the external power supply voltage Vext is made low so as become the same as the internal power supply voltage Vint, when a uniform gate oxide film thickness is used, it is not possible to thin the gate oxide film so as to meet with the internal power supply voltage Vint. The reason for this is that since the voltage of the word line is elevated, a voltage higher than the internal power supply voltage Vint is applied to the gate connected to the word line.

The voltage elevation of the word line will be described with reference to FIG. 17. As mentioned hereinbefore, the DRAM is so configured to hold information by accumulating the electric charge in the memory cell capacitor 150. In order to accumulate the electric charge in the memory cell capacitor 150, the bit line 153 is previously brought to the internal power supply voltage Vint, and the potential of the word line 152 is elevated to turn on the NMOS transistor 151. As a result, electric charge is supplied from the bit line 153 to the memory cell capacitor 152, so that the potential of the memory cell capacitor 152 becomes high.

Here, if the potential of the word line 152 is elevated only to the internal power supply voltage Vint, only the potential lower than the internal power supply voltage Vint by a threshold Vt of the NMOS transistor 151 can be written into the memory cell capacitor 150. Therefore, the potential of the word line 152 is made higher than the internal power supply voltage Vint by the threshold Vt of the NMOS transistor 151, so that the internal power supply voltage Vint can be written into the memory cell capacitor 150. This is the voltage elevation of the word line. If the voltage elevation of the word line is carried out, since the gate connected to the word line is supplied with a voltage higher than the internal power supply voltage Vint, the gate oxide film of the gate connected to the word line must be formed thick sufficiently to withstand the elevated voltage applied to the word line, thereby to ensure the reliability of the gate oxide film.

SUMMARY OF THE INVENTION

Accordingly, it is an object of the present invention to provide a method for manufacturing a semiconductor integrated circuit of triple well structure which has overcome the above mentioned problems of the prior art.

Another object of the present invention is to provide a method for manufacturing a semiconductor integrated circuit of triple well structure, capable of forming MOS transistors having different gate oxide film thicknesses in a single chip, without increasing the number of steps in the manufacturing process.

The above and other objects of the present invention are achieved in accordance with the present invention by a method for manufacturing a semiconductor integrated circuit of triple well structure, wherein a silicon oxide film is removed by an etching using a mask used for a selective ion implantation for forming a buried impurity layer, so that gate oxide films having two different film thicknesses are formed in a single chip.

According to another aspect of the present invention, there is provided a method for manufacturing a semiconductor integrated circuit of triple well structure, comprising the steps of forming an N-well, a P-well and a device isolation region in an N-type silicon substrate, thereafter forming a silicon oxide film on the whole surface of the silicon substrate by a thermal oxidation, forming a resist mask covering a region in which the silicon oxide film is required, ion-implanting a P-type impurity using the resist mask as a mask and with an implantation energy enough to allow the ion-implanted impurity to reach a bottom of the N-well and the P-well, so as to form a buried impurity layer, thereafter removing the silicon oxide film not covered with the resist mask by an etching, then removing the resist mask, and conducting a thermal oxidation on the whole surface of the silicon substrate so that a relatively thick gate oxide film is formed on a region which was covered with the resist mask, and a relatively thin gate oxide film is formed on a region which was not covered with the resist mask, and thereafter, forming a gate electrode and a source/drain diffused layer in a required well.

The region which was covered with the resist mask is an input/output circuit zone in which an external power supply voltage Vext is applied to a gate of a MOS transistor formed in the circuit zone, and a memory cell array zone of a DRAM in which an elevated voltage is applied to a word line.

In addition, a selected N-well is surrounded by the P-well and a buried P-type layer formed by the ion-implantation of the P-type impurity, so that the selected N-well is electrically isolated from the N-type silicon substrate According to still another aspect of the present invention, there is provided a method for manufacturing a semiconductor integrated circuit of triple well structure, comprising the steps of forming an N-well, a P-well and a device isolation region in a P-type silicon substrate, thereafter forming a silicon oxide film on the whole surface of the silicon substrate by a thermal oxidation, forming a resist mask covering a region in which the silicon oxide film is required, ion-implanting an N-type impurity using the resist mask as a mask and with an implantation energy enough to allow the ion-implanted impurity to reach a bottom of the N-well and the P-well, so as to form a buried impurity layer, thereafter removing the silicon oxide film not covered with the resist mask by an etching, then removing the resist mask, and conducting a thermal oxidation on the whole surface of the silicon substrate so that a relatively thick gate oxide film is formed on a region which was covered with the resist mask, and a relatively thin gate oxide film is formed on a region which was not covered with the resist mask, and thereafter, forming a gate electrode and a source/drain diffused layer in a required well.

The region which was covered with the resist mask is an input/output circuit zone in which an external power supply voltage Vext is applied to a gate of a MOS transistor formed in the circuit zone, and a memory cell array zone of a DRAM in which an elevated voltage is applied to a word line.

In addition, a selected P-well is surrounded by the N-well and a buried N-type layer formed by the ion-implantation of the N-type impurity, so that the selected P-well is electrically isolated from the P-type silicon substrate.

The above and other objects, features and advantages of the present invention will be apparent from the following description of preferred embodiments of the invention with reference to the accompanying drawings.

DESCRIPTION OF THE PREFERRED EMBODIMENTS

Embodiments of the present invention will be described in detail with reference to the drawings.

First Embodiment

Figure 4:
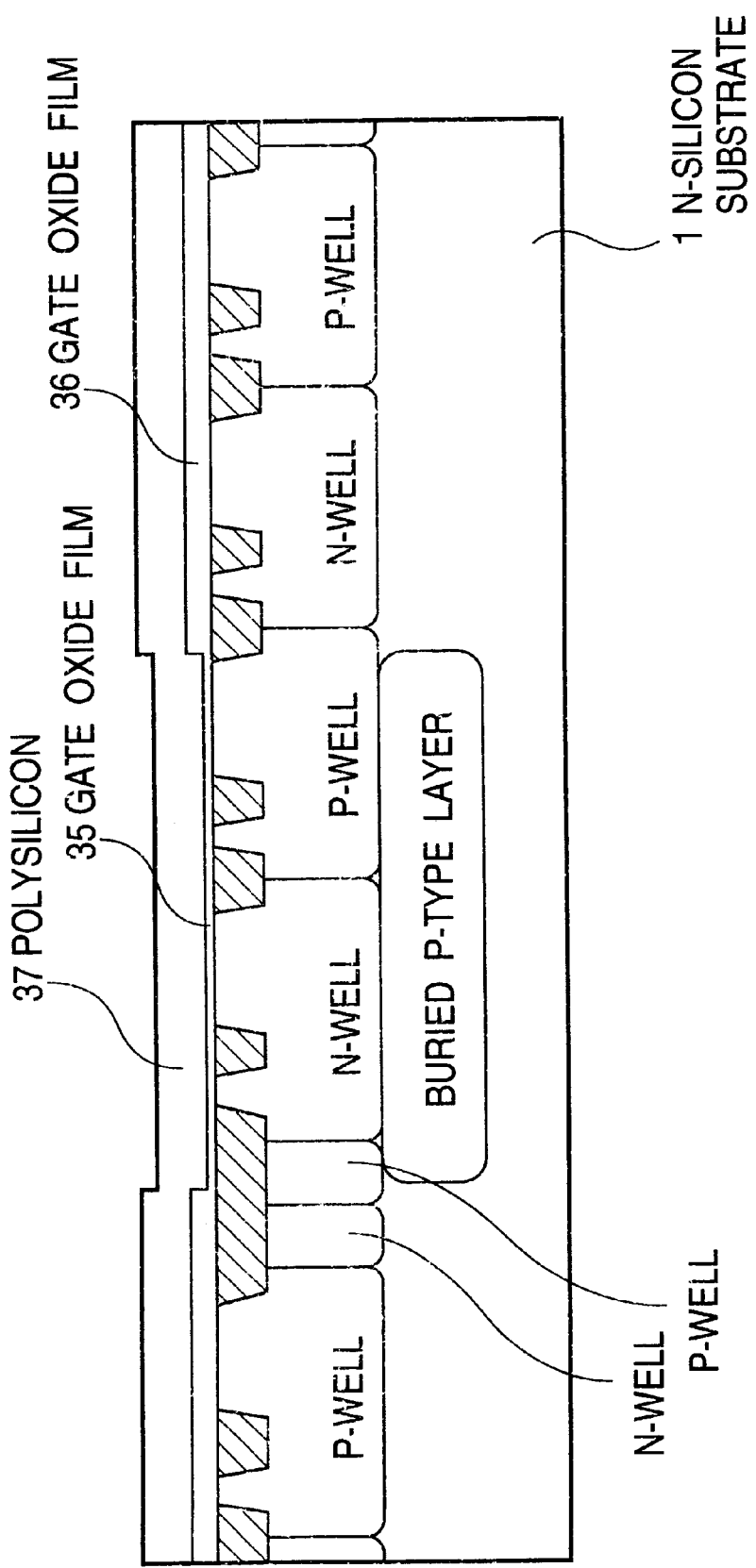
Figure 5:
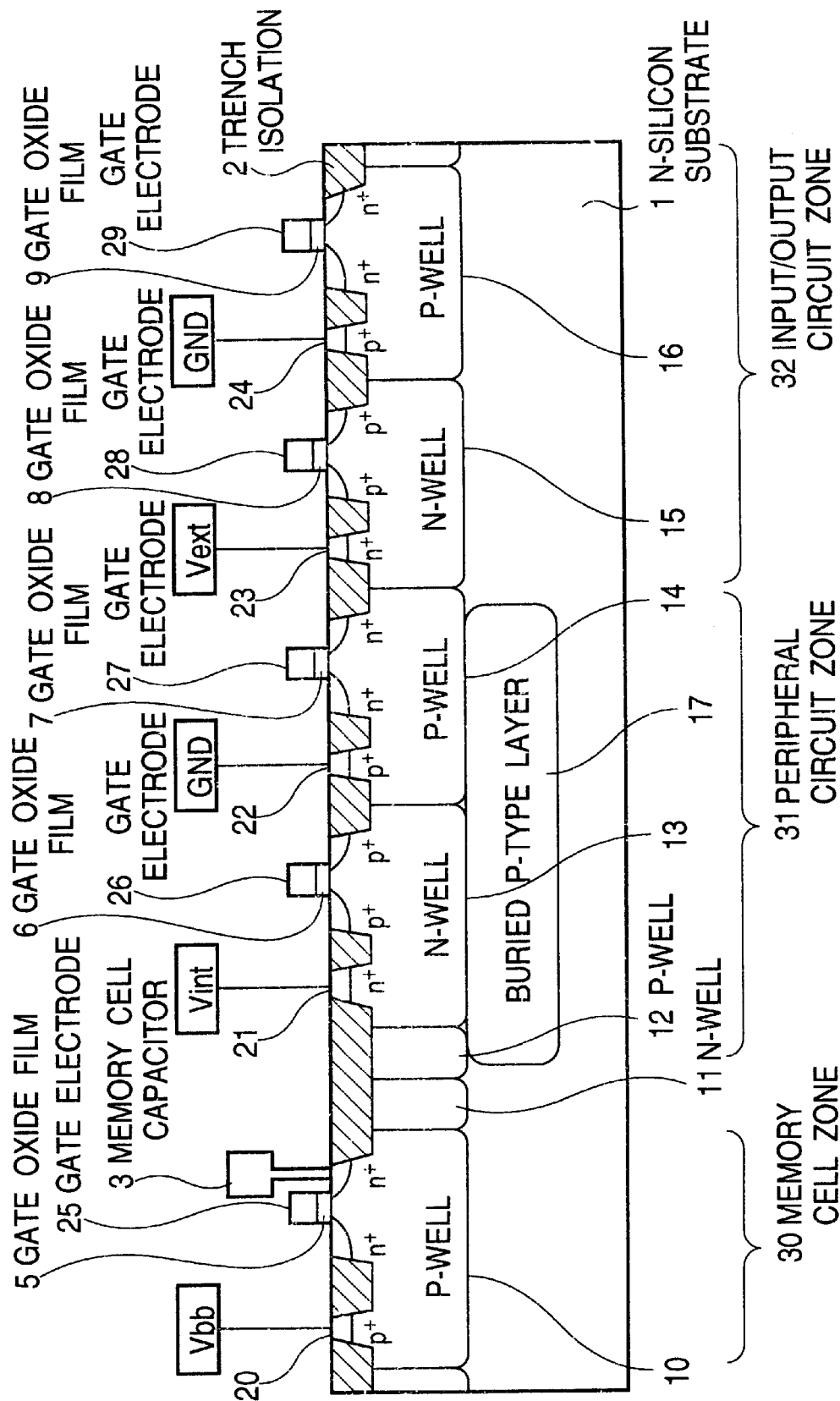
Figure 6:
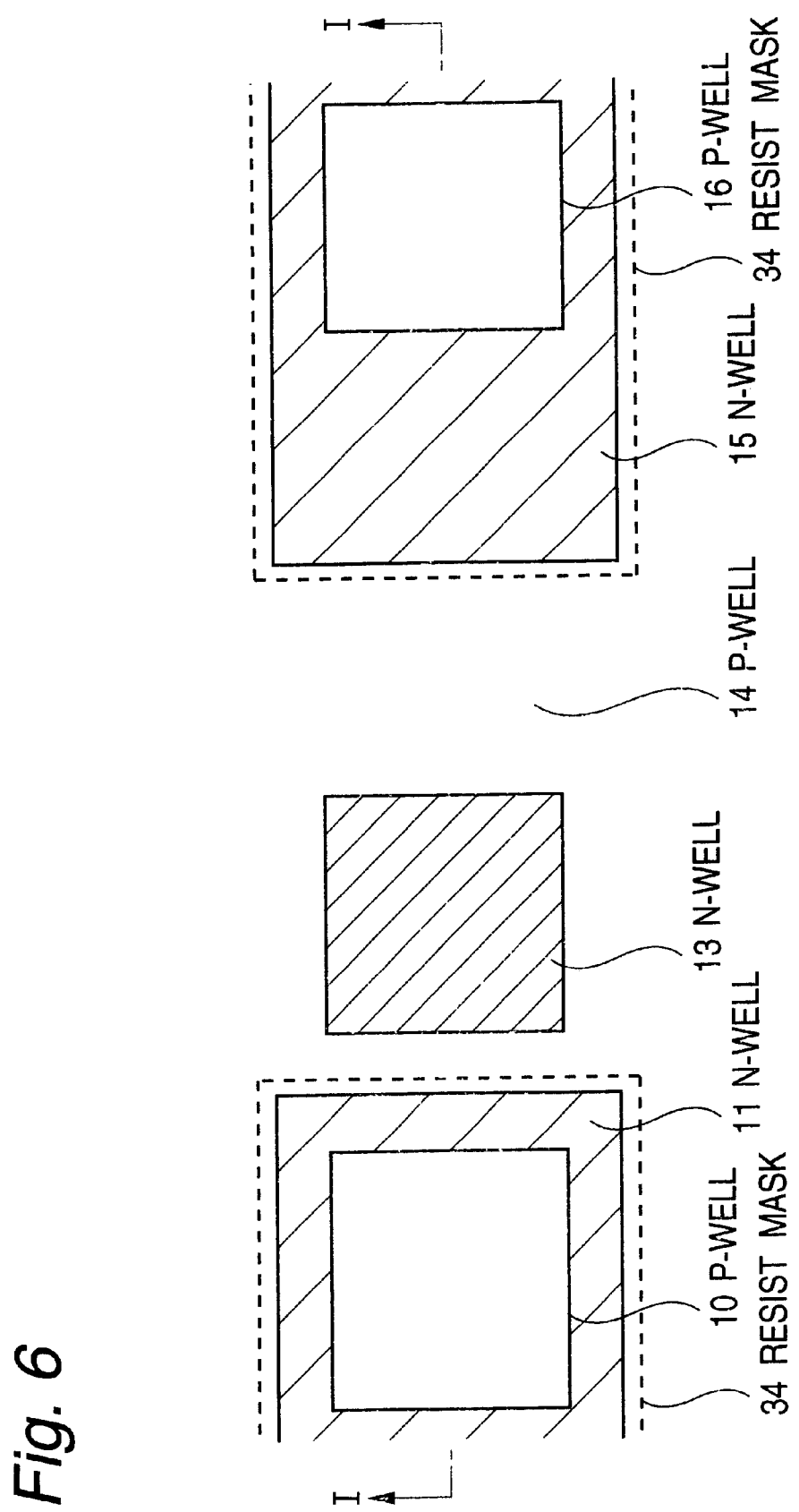
FIG. 6 is a diagrammatic plan view of the DRAM formed in accordance with the DRAM manufacturing method which is the first embodiment of the present invention.

FIGS. 1 to 5 are diagrammatic sectional views of the DRAM having the triple well structure, for illustrating a first embodiment of the present invention for manufacturing the DRAM having the triple well structure, and FIG. 6 is a diagrammatic plan view of the DRAM formed in accordance with the DRAM manufacturing method which is the first embodiment of the present invention. In FIG. 6, an N-well formation region is hatched for making it easier to understand, and a P-well is formed in a region in which the N-well is not formed. FIGS. 1 to 5 are sectional views taken along the line I—I in FIG. 6.

As shown in FIG. 5, in the DRAM of this embodiment, N-wells 11, 13 and 15 and P-wells 10, 12, 14 and 16 are formed in an N-type silicon substrate 1. A buried P-type layer 17 is formed in the silicon substrate 1 within a peripheral circuit zone 31. The N-well 13 within the peripheral circuit zone 31 is electrically isolated from the N-type silicon substrate 1 by means of the P-wells 12 and 14 and the buried P-type layer 17. In addition, the gate oxide film thickness includes two different thicknesses. In the peripheral circuit zone 31 within which the buried P-type layer 17 is formed, gate oxide films 6 and 7 have the film thickness of 55 Å, and in a memory cell zone 30 and an input/output circuit zone 32 in which no buried P-type layer 17 is formed, gate, oxide films 5, 8 and 9 have the film thickness of 70 Å.

Now, the process for manufacturing the above mentioned DRAM will be described.

Figure 1:
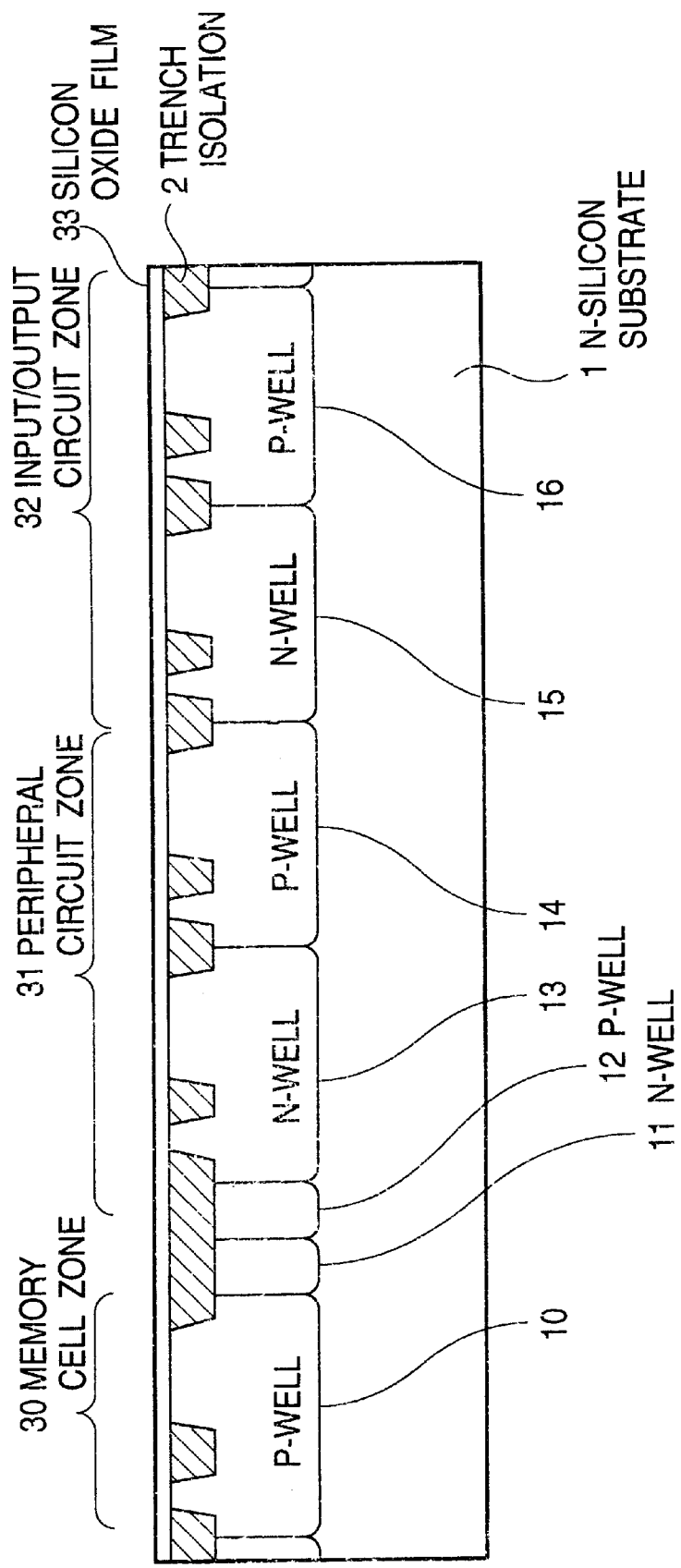
FIGS. 1 to 5 are diagrammatic sectional views of the DRAM for illustrating the DRAM manufacturing method which is a first embodiment of the present invention.

As shown in FIG. 1, at a surface of the N-type silicon substrate 1, a device isolation 2 is formed by means of a trench isolation. Succeedingly, by a conventional resist mask and photolithography, phosphorus ions are selectively ion-implanted into N-well formation regions with an implantation energy of 700 keV and a dose of $2 \times 10^{13} \text{cm}^{-2}$, to form the N-wells 11, 13 and 15. Furthermore, also by a conventional resist mask and photolithography, boron ions are selectively ion-implanted into P-well formation regions with an implantation energy of 300 keV and a dose of $2 \times 10^{13}$ cm$^{-2}$, to form the P-wells 10, 12, 14 and 16.

Figure 2:
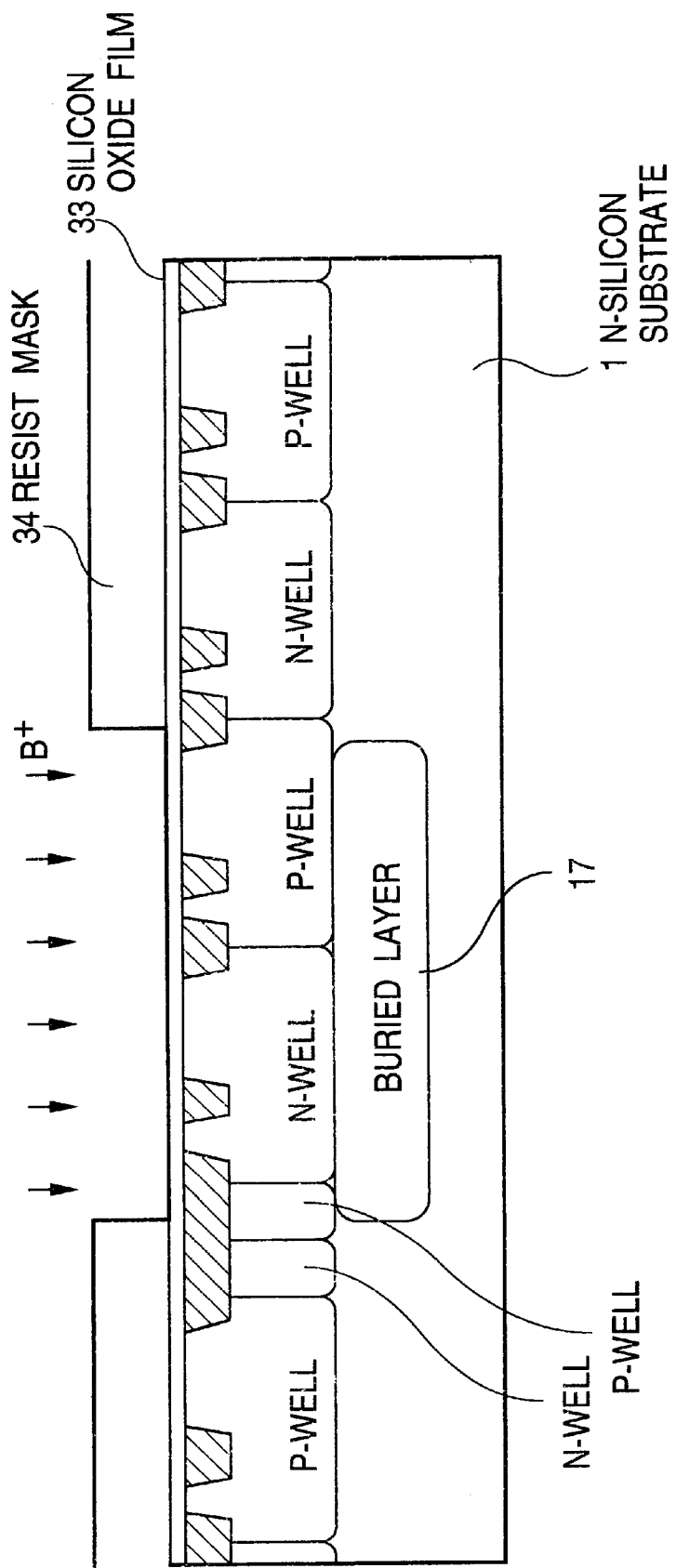
Figure 3:
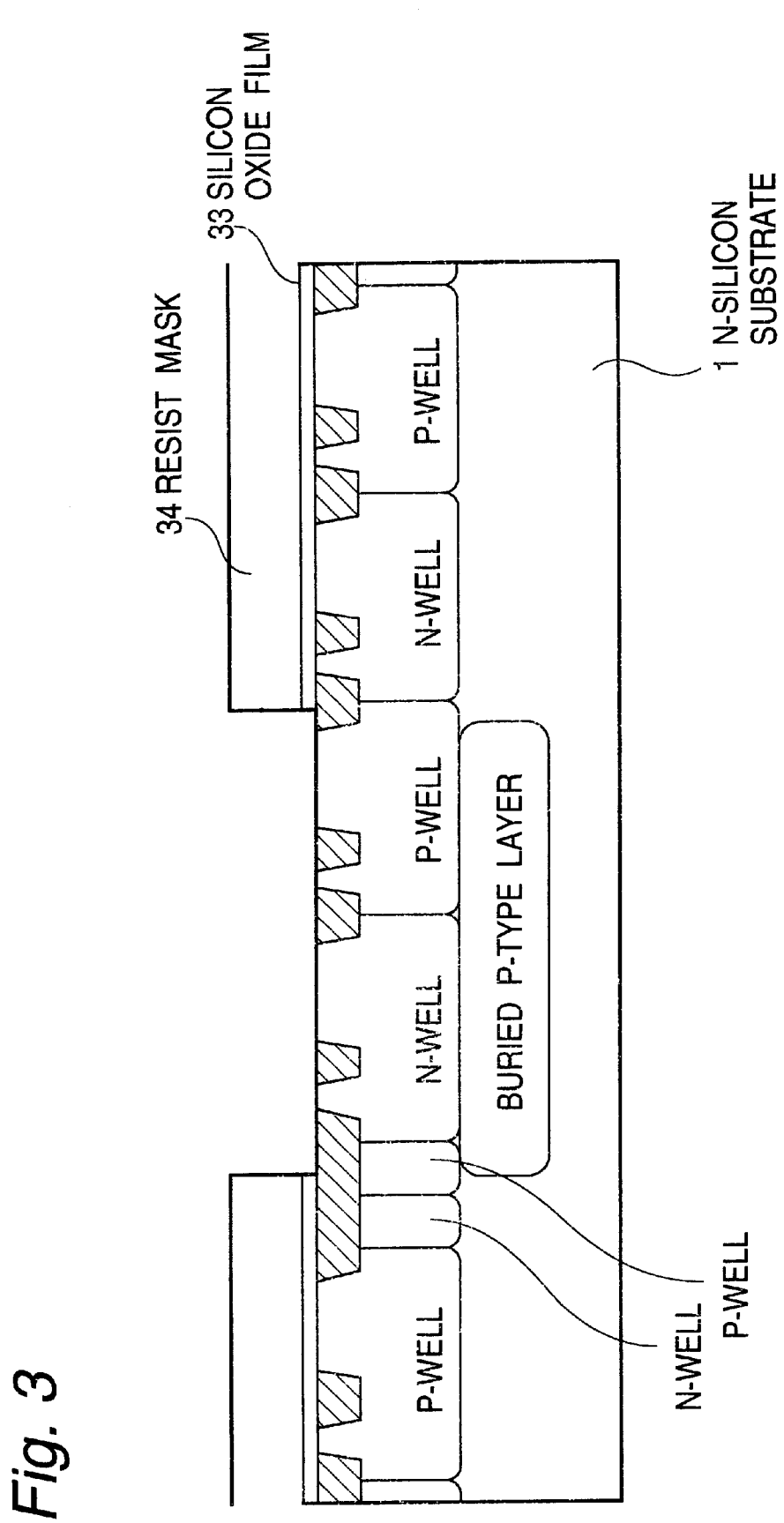

After the N-wells and the P-wells are formed, a thermal oxidation is conducted to form a silicon oxide film 33 having a thickness of 40 Å on the whole surface of the silicon substrate 1. Succeedingly, as shown in FIG. 2, a resist mask 34 is formed to cover the memory cell zone 30 and the input/output circuit zone 32 by means of a photolithography. Here, the contour of the region covered by the resist mask 34 is indicated by a dotted line 34 in FIG. 6. After the memory cell zone 30 and the input/output circuit zone 32 are covered with the resist mask 34, boron ions are ion-implanted with an implantation energy of 1 MeV and a dose of $1 \times 10^{13}$ cm$^{-2}$. With this ion implantation, a buried P-type layer 17 is formed in the inside of the substrate in the region which is not covered with the resist mask 34. After the buried P-type layer 17 is formed, the silicon oxide film 33 which is not covered with the resist mask 34 is etch-removed by a buffered HF, as shown in FIG. 3. Thereafter, the resist mask 34 is removed After the resist mask 34 is removed, the thermal oxidation is conducted again, so that a gate oxide film 35 having a thickness of 55 Å is formed on an exposed surface of the silicon substrate, as shown in FIG. 4. At this time, in the region in which the surface is already covered by the silicon oxide film 33, since there exists the silicon oxide film having the thickness of 40 Å, a gate oxide film 36 having a total thickness of 70 Å is formed by this second thermal oxidation. After the gate oxide films 35 and 36 are formed, a polysilicon film 37 containing phosphorus of $1 \times 10^{20}$ cm$^{-3}$ in concentration is deposited on the whole surface. Here, in place of the signal polysilicon layer, it is possible to use a stacked layer of a polysilicon and a metal silicide, for example, a tungsten silicide.

After the polysilicon film 37 is deposited, the polysilicon film 37 is patterned by a photolithography and a dry etching, to form the gate electrodes 25, 26, 27, 28 and 29 as shown in FIG. 5. Furthermore, in accordance with a conventional DRAM manufacturing process, an n$^+$ diffused layer and a p$^+$ diffused layer are selectively formed at the N-type surface of the silicon substrate 1, so that a source, a drain and a well contact are formed the n$^+$ diffused layer and the p$^+$ diffused layer. In addition, a memory cell capacitor 3 is formed in the memory dell zone 30. Thus, the DRAM of the first embodiment is manufactured.

Since the DRAM of the first embodiment has a triple well structure, the DRAM of the first embodiment has an advantage similar to those obtained in the prior art triple well structure. Namely, as shown in FIG. 5, the N-well 13 in the peripheral circuit zone 31 is covered by the P-wells 12 and 14 and the buried P-type layer 17, the N-well 13 is electrically isolated from the N-well 15 in the input/output circuit zone 32. Therefore, the internal power supply voltage Vint in the N-well 13 of the peripheral circuit zone 31 and the external power supply voltage Vext in the N-well 15 of the input/output circuit zone 32, can be made independent of each other. In this embodiment, Vint=2V and Vext=3.5V.

In the DRAM of this first embodiment, since the N-type silicon substrate 1 is used, the P-well 14 of the peripheral circuit zone 31, the P-well 16 of the input/output circuit zone 32 and the P-well 10 of the memory cell zone 30 are all electrically isolated from each other. Accordingly, even if a negative voltage is applied to the n$^+$ diffused layer within the P-well 16 of the input/output circuit zone 32 so that electrons are emitted into the P-well 16, these electrons are absorbed by the N-type silicon substrate 1, with the result that no influence is given to the memory cell zone 30. In addition, electric noises in the peripheral circuit zone 31 and in the input/output circuit zone 32 never propagate to the P-well 10 of the memory cell zone 30. Furthermore, it is possible to set a potential Vbb of the P-well 10 of the memory cell zone 30 to −1V and to set the potential of the P-well 14 of the peripheral circuit zone 31 and the P-well 16 of the input/output circuit zone 32 to a ground potential.

Moreover, the DRAM of this first embodiment has two different gate oxide film thicknesses. It is considered that the internal power supply voltage Vint is 2V and the external power supply voltage Vext and the elevated voltage of the word line are 3.5V. The gate oxide films 5, 8 and 9 in the memory cell zone 30 and the input/output circuit zone 32, which are applied with the external power supply voltage Vext or the elevated voltage of the word line, have the film thickness of 70 Å, which is thicker than 55 Å of the film thickness of the gate oxide films 6 and 7 in the peripheral circuit zone 31. When the voltage of 3.5V is applied to the gate oxide film having the film thickness of 70 Å, an electric field in the gate oxide film becomes 5 MeV/cm. If the electric field is 5 MeV/cm, reliability of the gate oxide film can be ensured. On the other hand, since the film thickness of the gate oxide films 6 and 7 in the peripheral circuit zone 31 is as thin as 55 Å, the ON current of the MOS transistor in the peripheral circuit zone 31 becomes large.

According to the gradual channel approximation which is a theoretical equation of the drain current in the MOSFET transistor, the ON current is in proportion to a reciprocal number of the gate oxide film thickness. Therefore, comparing with a case in which only the one kind of gate oxide film thickness is used so that the gate oxide film having the film thickness of 70 Å is used in not only the memory cell zone 30 and the input/output circuit zone 32 but also the peripheral circuit zone 31, the ON current of the MOSFET transistor in the peripheral circuit zone 31 using the gate oxide film having the film thickness of 55 Å, within the DRAM of this embodiment, increases by about 27%. As a result, the operation speed is elevated. In the meanwhile, since the internal power supply voltage Vint in the peripheral circuit zone 31 is 2V, the reliability of the gate oxide film can be ensured with the film thickness of 55 Å.

As mentioned above, in the first embodiment of the DRAM having the triple well structure, the two different gate oxide film thicknesses are realized with adding no mask step to a prior art process for manufacturing the DRAM having the triple well structure. The reason for this is that, the mask used for ion-implantation for forming the triple well structure is used as the resist mask used for etch-removing the silicon oxide film 33 in order to realize the two different gate oxide film thicknesses. Therefore, a reduced power consumption and a high speed operation can be realized with a low cost.

Second Embodiment

Now, a second embodiment of the present invention will be described. The second embodiment of the present invention is that the present invention is applied to a high resistance load type SRAM memory cell.

Figure 7:
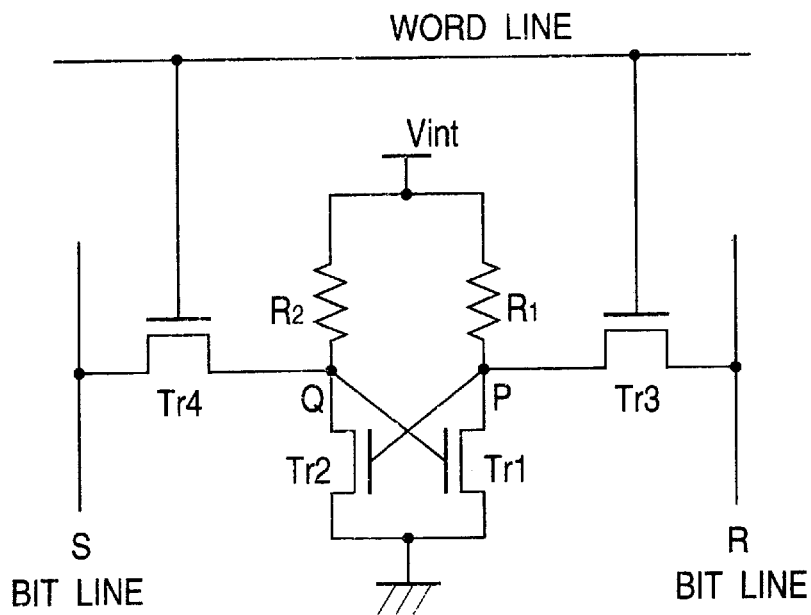
FIG. 7 is a circuit diagram of a high resistance load type SRAM memory cell which is a second embodiment of the present invention.
Figure 17:
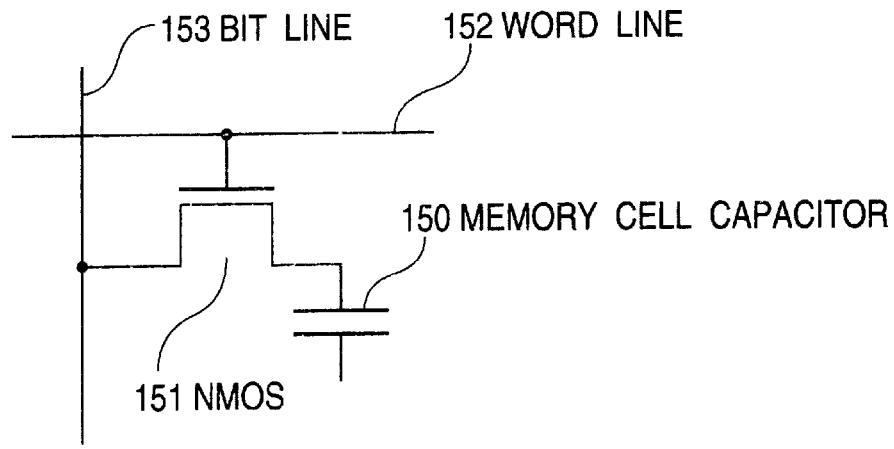
FIG. 17 is an equivalent circuit diagram of the prior art DRAM cell.

FIG. 7 is a circuit diagram of a high resistance load type SRAM memory cell. This includes an inverter formed of a driver transistor Tr1 and a high resistance load R1, and another formed of a driver transistor Tr2 and a high resistance load R2. These inverters are cross-connected to each other in such a manner that an input of each inverter is connected to an output (P, Q) of the other inverter. The information is held in such a manner that one of two output nodes P and Q is at a high level and the other node is at a low level, The two output nodes P and Q are connected to bit lines R and S through access transistors Tr3 and Tr4, respectively. A gate of the access transistors Tr3 and Tr4 are connected to a word line. By elevating the potential of the word line, these access transistors Tr3 and Tr4 are turned on, so tat the potentials on the nodes P and Q are read out to the bit lines R and S, or the potentials on the bit lines R and S are written to the nodes P and Q.

Now, the case of writing a high potential to the node P will be described.

First, the bit line R is brought to the internal power supply voltage Vint and the bit line S is brought to the ground potential. In this condition, the word line potential Vwl is elevated, so that access transistors Tr3 and Tr4 are turned on. As a result, the high potential is written into the node P, and a low potential is written into the node Q.

However, if the word line potential Vwl is elevated only to the internal power supply voltage Vint, only the voltage lower than the internal power supply voltage Vint by a threshold Vt of the access transistor Tr3 can be written to the node P. After a sufficiently long time has elapsed, the potential of the node P becomes further high because of a current supplied through the high resistance resistor R1. However, since a long time is required until the potential of the node P becomes further high, this effect cannot be expected just after the writing.

If the potential written into the node is low, the condition of the memory cell is liable to become instable. This is remarkable when the internal power supply voltage Vint is low. A means for preventing this problem is a voltage elevation of the word line. Namely, the voltage Vwl applied to the word line is made higher than the internal power supply voltage Vint, so that the potential of the node reaches the internal power supply voltage Vint. By using this method, since the internal power supply voltage Vint can be written into the node, the condition of the memory cell becomes stable. Because of this, it is necessary to use the voltage elevation of the word line in order to cause the high resistance load type SRAM to stably operate with a reduced voltage.

Here, the structure of the high resistance load type SRAM memory cell will be described (See Symp. On VLSI Tech. Dig., P145, FIG. 1(a)).

Figure 8:
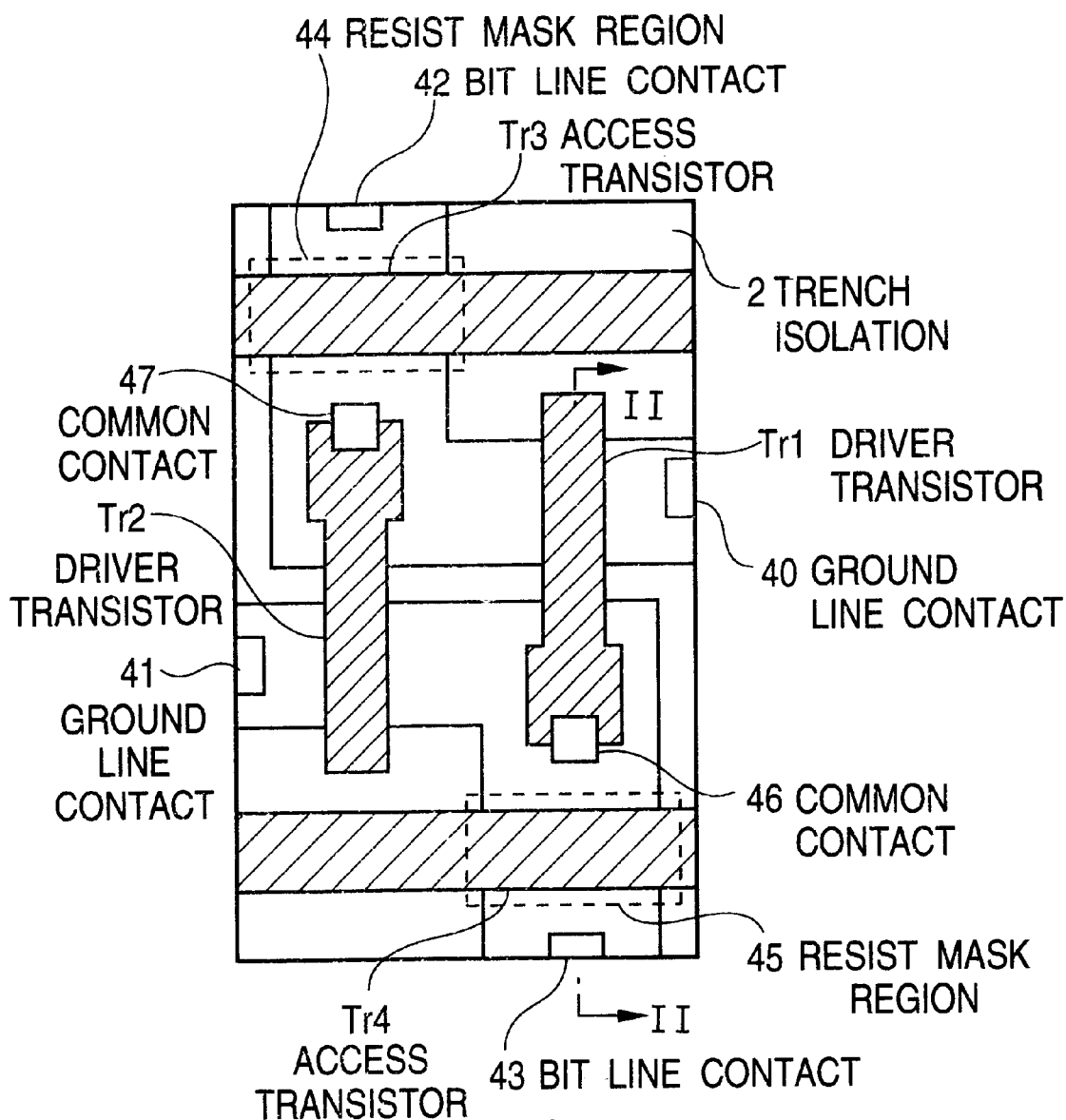
FIG. 8 is a diagrammatic plan view of the high resistance load type SRAM memory cell which is the second embodiment of the present invention.

FIG. 8 is a diagrammatic plan view of the high resistance load type SRAM memory cell. In FIG. 8, a gate electrode layer is hatched in order to make it easier to understand. As mentioned above, the memory cell includes four transistors. The two access transistors Tr3 and Tr4 have a gate in common to the word line. In the SRAM adapted to the word line voltage elevation, since the word line is supplied with a voltage higher than the internal power supply voltage Vint, the gate of the two access transistors Tr3 and Tr4 is subjected to the voltage higher than the internal power supply voltage Vint. On the other hand, the gate of the driver transistors Tr1 and Tr2 is subjected to only the internal power supply voltage Vint at a maximum. Therefore, in the high resistance load type SRAM memory cell, one having a thick gate oxide film in order to ensure reliability is only the two access transistors of the four transistors included in the memory cell.

Figure 9C:
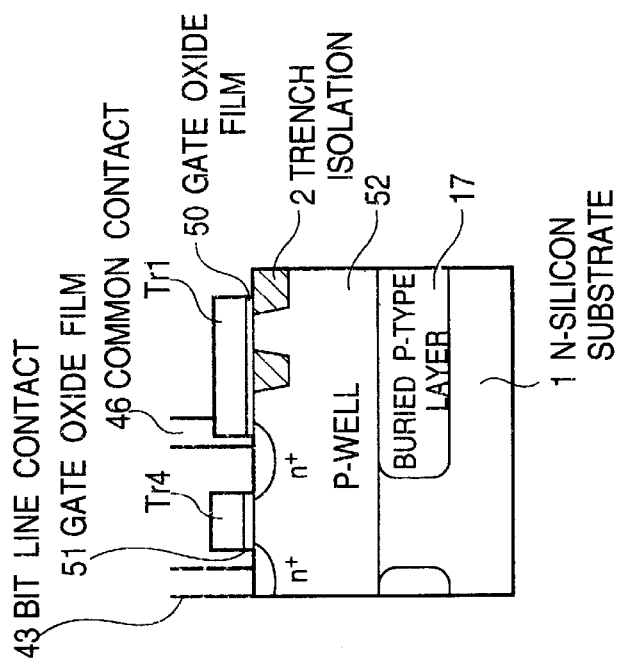
FIGS. 9A, 9B and 9C are diagrammatic sectional views for illustrating the process for manufacturing the high resistance load type SRAM memory cell which is the second embodiment of the present invention.

Now, the process for manufacturing the high resistance load type SRAM memory cell which is the second embodiment of the present invention, will be described with reference to FIGS. 9A, 9B and 9C, which are diagrammatic sectional views taken along the line II—II in FIG. 8, for illustrating the process for manufacturing the high resistance load type SRAM memory cell. Incidentally, the second embodiment is different from the first embodiment only in the memory cell zone, the peripheral circuit zone and the input/output circuit zone will be omitted.

Figure 9A:
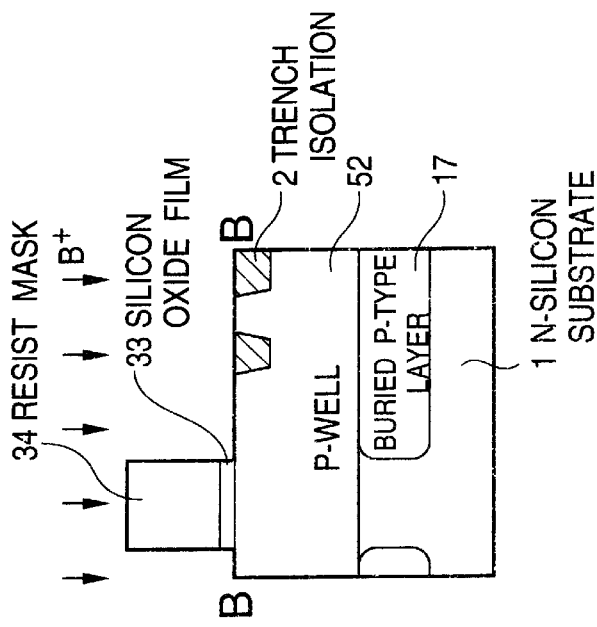
Figure 9B:
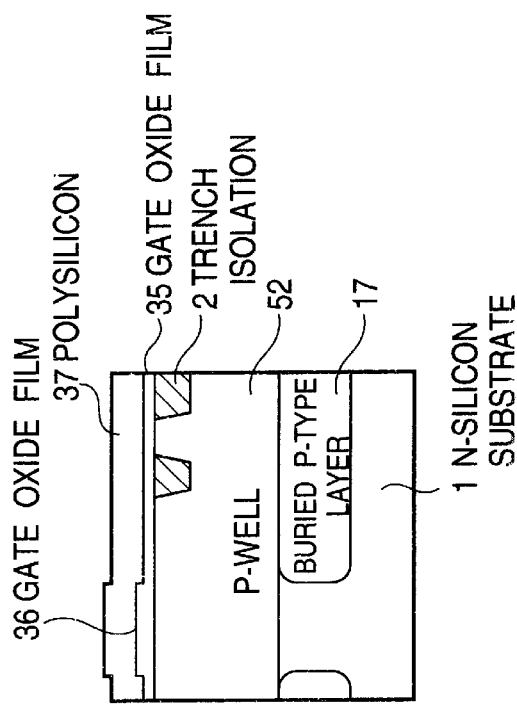

First, as shown in FIG. 9A, and similarly to the first embodiment, a trench device isolation 2, an N-well (not shown) and a P-well 52 are formed at a surface of an N-type silicon substrate 1, and the whole surface of the substrate 1 is thermally oxidized to form a silicon oxide film 22 having the thickness of 40 Å. Succeedingly, a region for forming the gate of the access transistors (a region surrounded by a dotted line 45 in FIG. 8) is covered with a resist mask 34. At this time, an input/output circuit zone (not shown) is also covered with the resist mask 34, similarly to the first embodiment. In this condition, boron ions are ion-implanted with an implantation energy of 1 MeV and a dose of $1\times10^{13}$ $cm^{-2}$, so that a buried P-type layer 17 is formed in the inside of the substrate. This buried P-type layer 17 is formed in the peripheral circuit zone to cover the N-well, but simply becomes a portion of the P-well in the memory cell zone.

Succeedingly, the silicon oxide film 33 which is not covered with the resist mask 34 is etch-removed, and then, the resist mask 34 is removed. Thereafter, the thermal oxidation is conducted again at the whole surface, so that a gate oxide film 35 having a thickness of 55 Å is formed on an exposed surface of the silicon substrate, as shown in FIG. 9B. Thus, gate oxide films 35 and 36 having two different film thicknesses are formed, similarly to the first embodiment. The gate oxide film 35 has a thickness of 55 Å, and the gate oxide film 36 has a thickness of 70 Å. A polysilicon film 37 is deposited on the whole surface, and then, the polysilicon film 37 is patterned. Furthermore, a conventional process is conducted, so that the structure as shown in FIG. 9C can be obtained. In this structure, the gate oxide 50 of the driver transistor Tr1 has a thickness of 55 Å, and the gate oxide 51 of the access transistor Tr4 has a thickness of 70 Å. Namely, in this embodiment of the high resistance load type SRAM of the triple well structure, the two gate oxide film thicknesses can be realized with adding no mask step, similarly to the first embodiment.

Third Embodiment

Now, a third embodiment of the present invention will be described.

This third embodiment of the present invention is a DRAM using a P-type silicon substrate. FIG. 15 is a diagrammatic plan view of the DRAM formed in accordance with the DRAM manufacturing method which is the third embodiment of the present invention, and FIGS. 10 to 14 are diagrammatic sectional views taken along the line III—III in FIG. 15, for illustrating the DRAM manufacturing method which is the third embodiment of the present invention.

Now, the process for manufacturing the DRAM of this third embodiment will be described.

Figure 10:
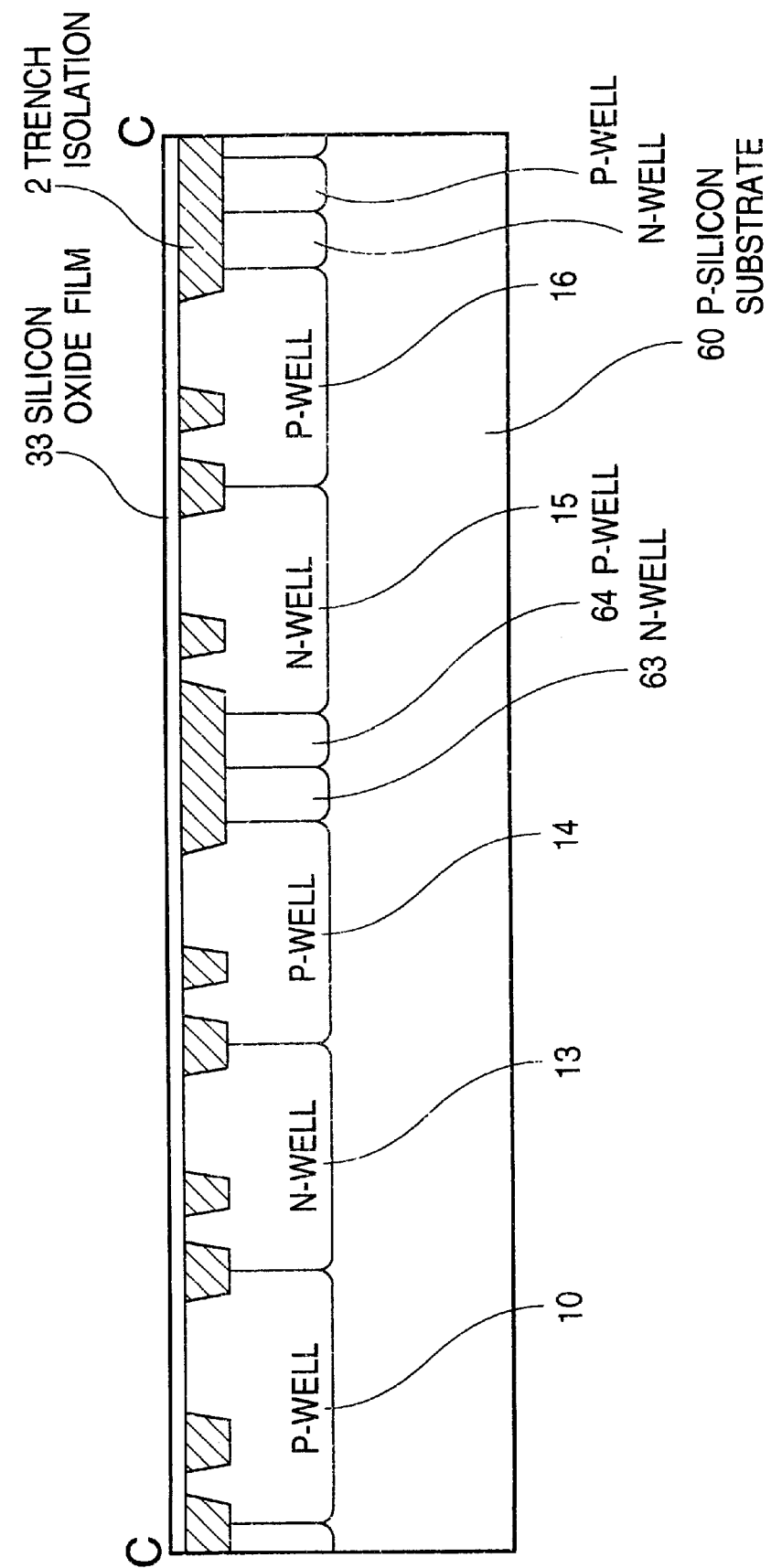
FIGS. 10 to 14 are diagrammatic sectional views of the DRAM for illustrating the DRAM manufacturing method which is a third embodiment of the present invention.
Figure 11:
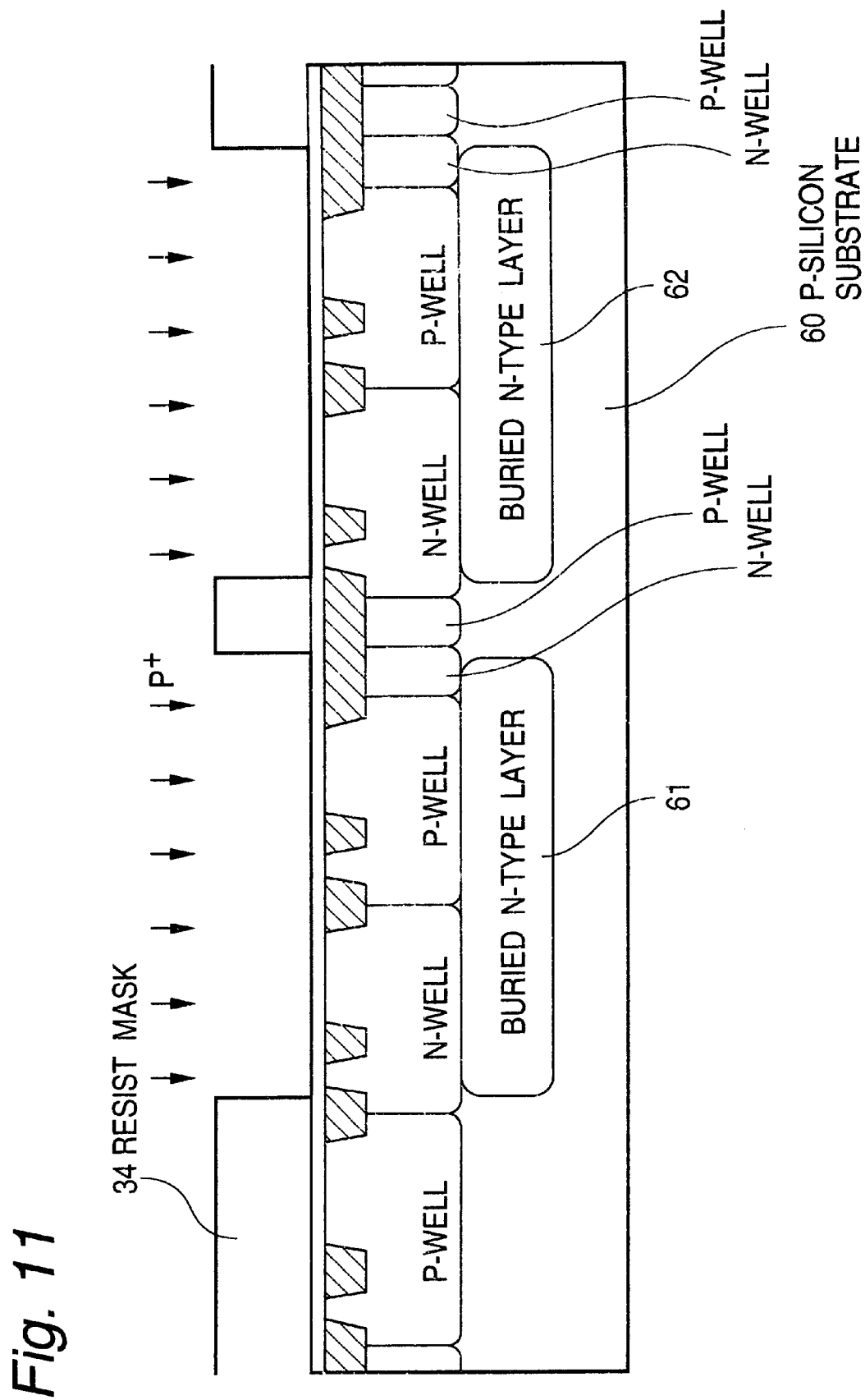

First, as shown in FIG. 10, at a surface of a P-type silicon substrate 60, a trench device isolation 2, N-wells 13, 63 and 15 and P-wells 10, 14, 64 and 16 are formed. Succeedingly, a thermal oxidation is conducted to form a silicon oxide film 33 having a thickness of 40 Å on the whole surface of the silicon substrate 60. Thereafter, as shown in FIG. 11, a resist mask 34 is formed to cover a buried N-type layer masking region confined by a dotted line 34 in FIG. 15, and then, phosphorus ions are ion-implanted with an implantation energy of 1.5 MeV and a dose of $1 \times 10^{13}$ cm$^{-2}$ by using the resist mask 34 as a mask, so that buried N-type layers 61 and 62 are formed in the inside of the substrate.

Figure 12:
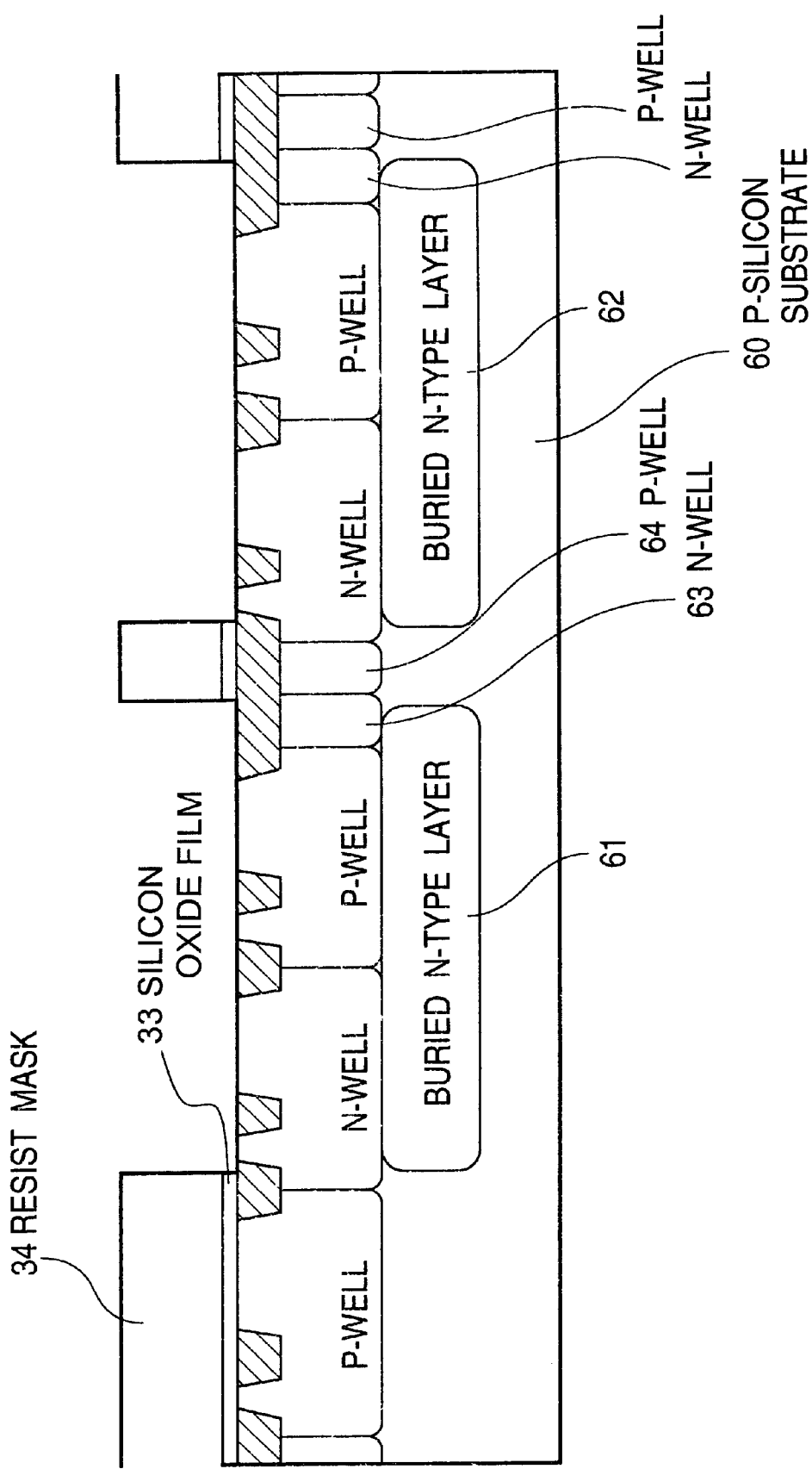

Succeedingly, as shown in FIG. 12, the silicon oxide film 33 which is not covered with the resist mask 34 is etch-removed, and then, the resist mask 34 is removed.

Figure 13:
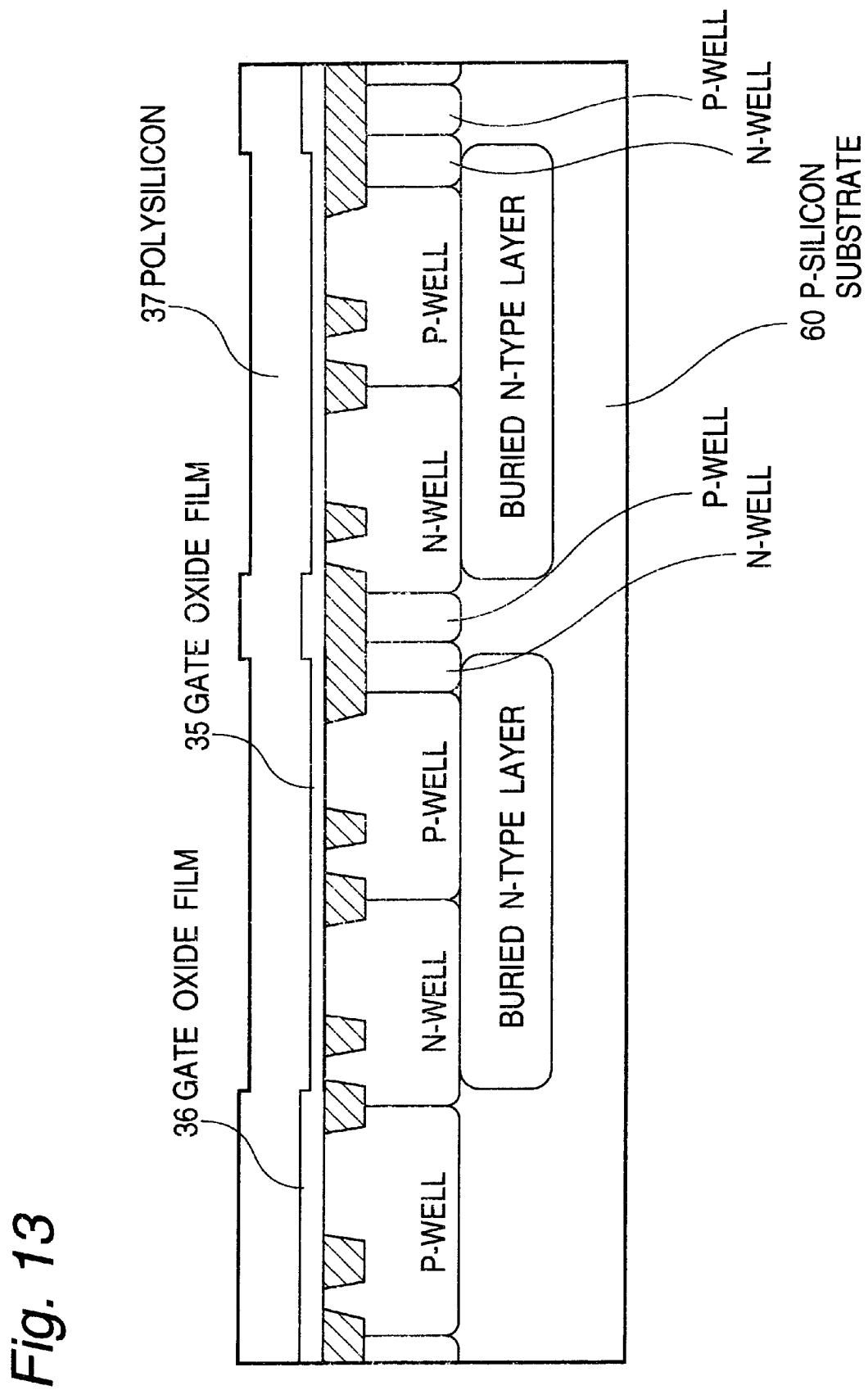

After the resist mask 34 is removed, the thermal oxidation is conducted again at the whole surface, so that a gate oxide film 35 having a thickness of 55 Å is formed on an exposed surface of the silicon substrate, as shown in FIG. 13. With this thermal oxidation, in the region in which the silicon oxide film 33 was removed, the gate oxide film 35 having a thickness of 55 Å is formed, and in the region in which the surface is already covered by the silicon oxide film 33, a gate oxide film 36 having a total thickness of 70 Å is formed. Thereafter, a polysilicon film 37 is deposited on the whole surface.

Figure 14:
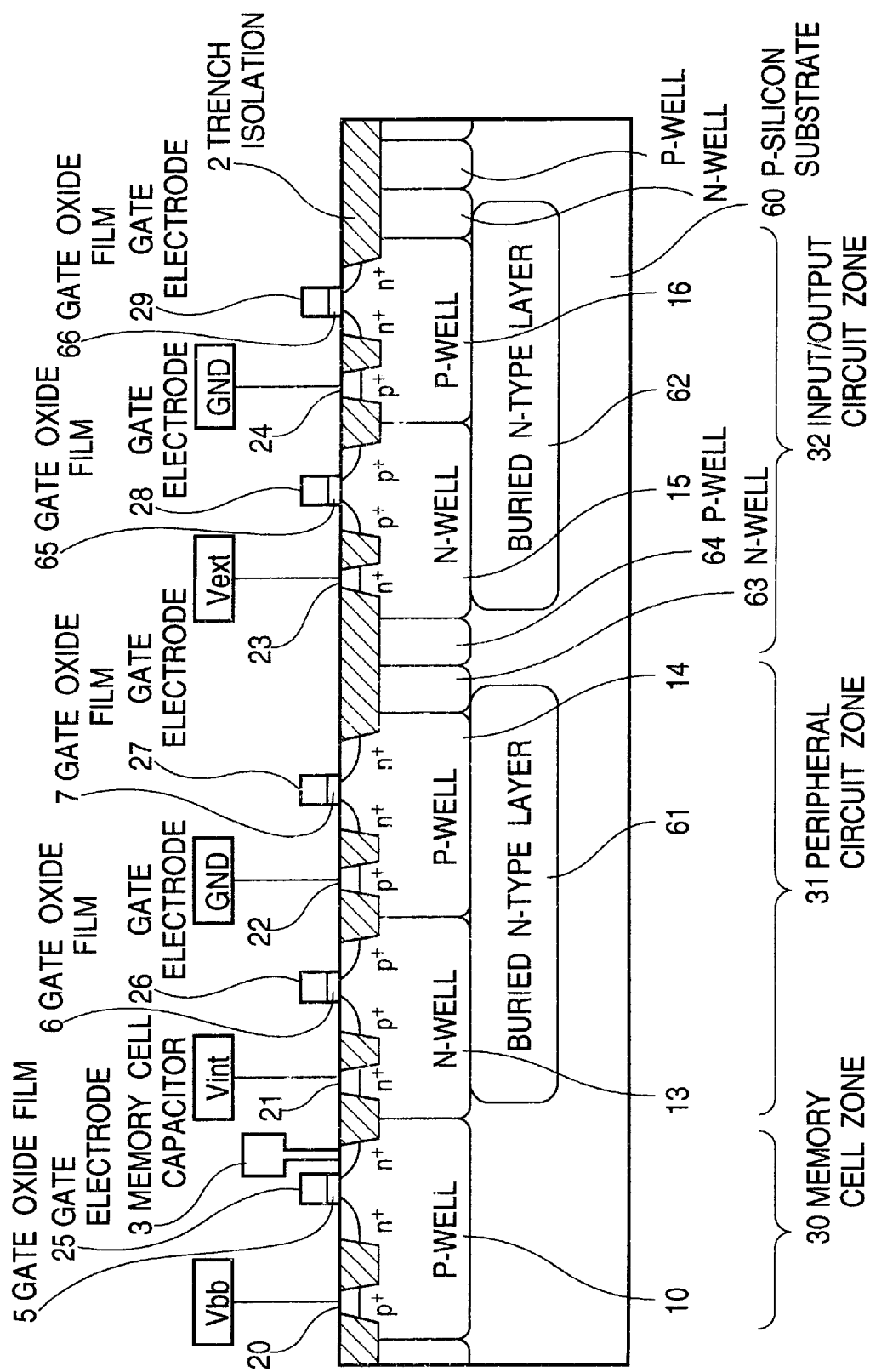
Figure 15:
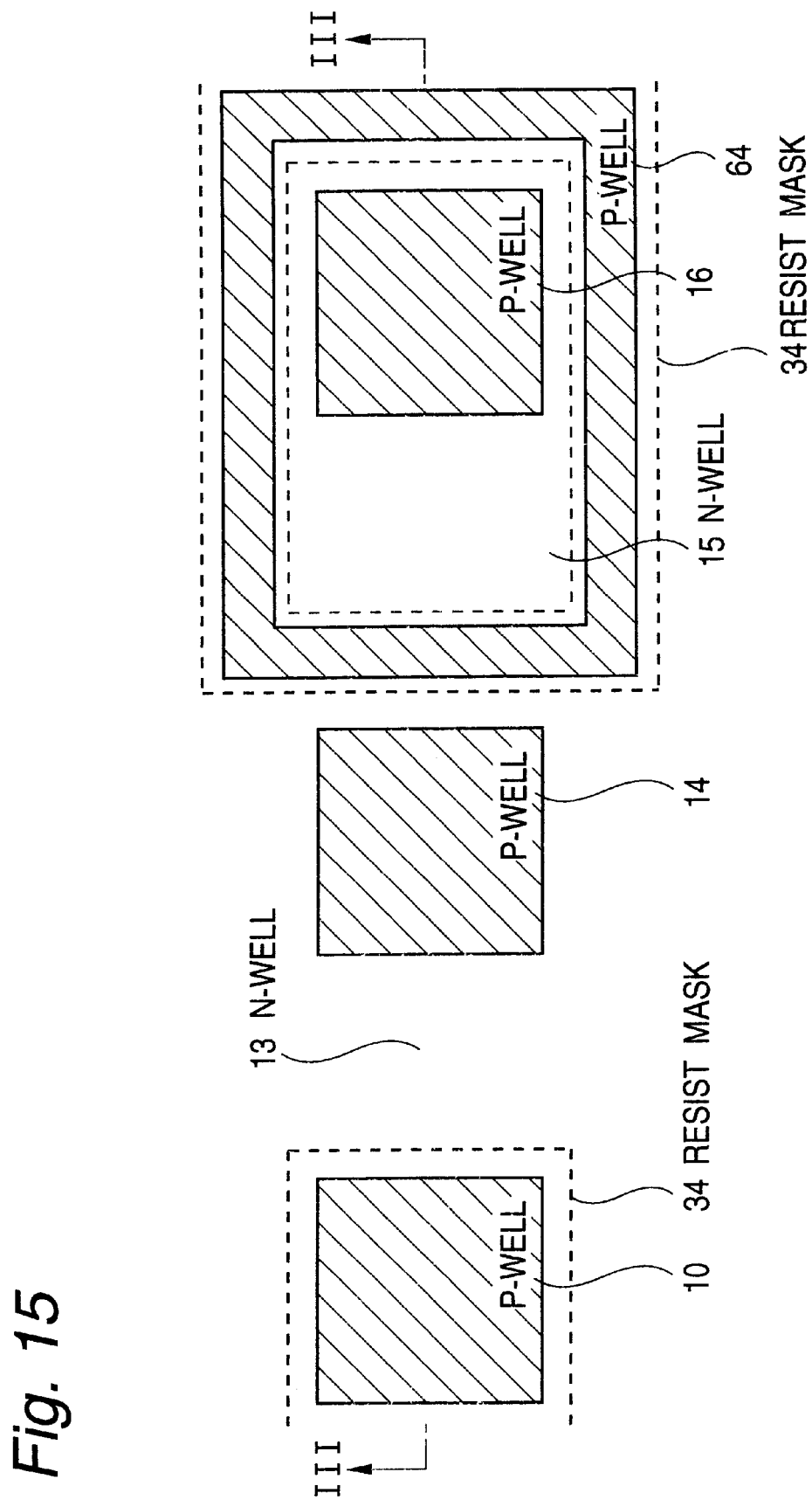
FIG. 15 is a diagrammatic plan view of the DRAM formed in accordance with the DRAM manufacturing method which is the third embodiment of the present invention.
Figure 16:
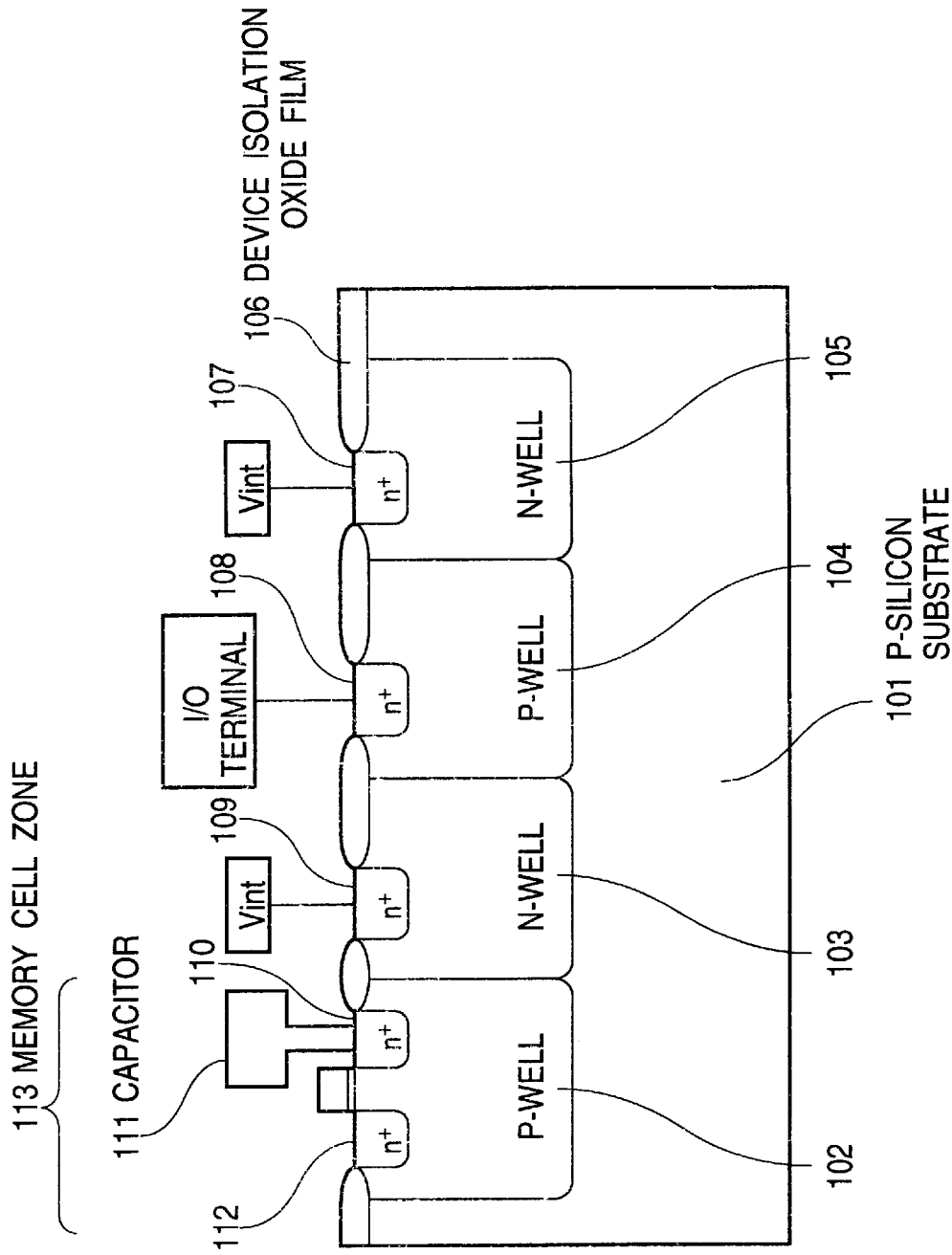
FIG. 16 is a diagrammatic sectional view for illustrating the prior art DRAM cell.
Figure 18:
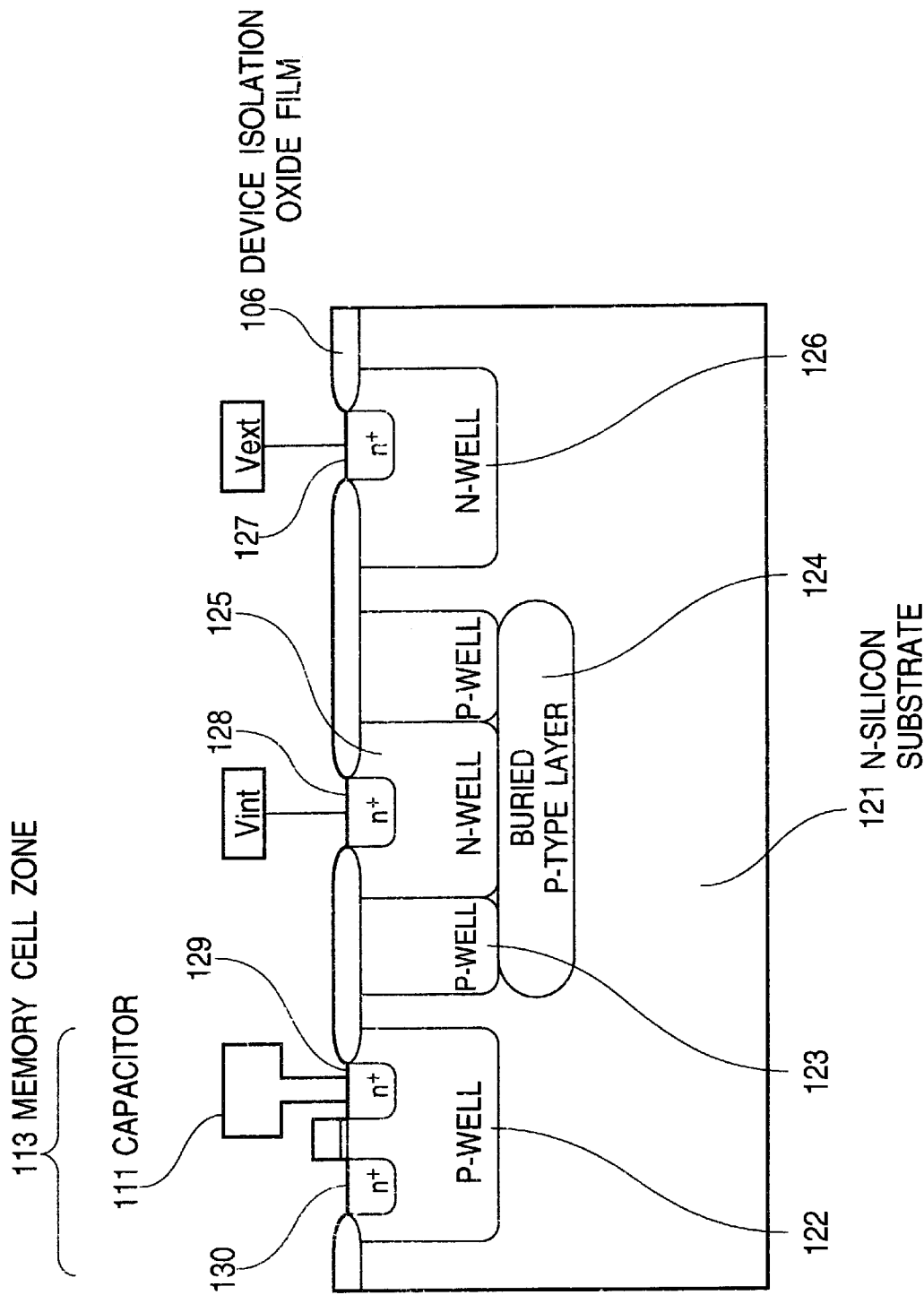
FIG. 18 is a diagrammatic sectional view for illustrating the prior art triple well structure and FIGS. 19A and 19B are diagrammatic sectional views for illustrating a prior art process for manufacturing the semiconductor integrated circuit.
Figure 19A:
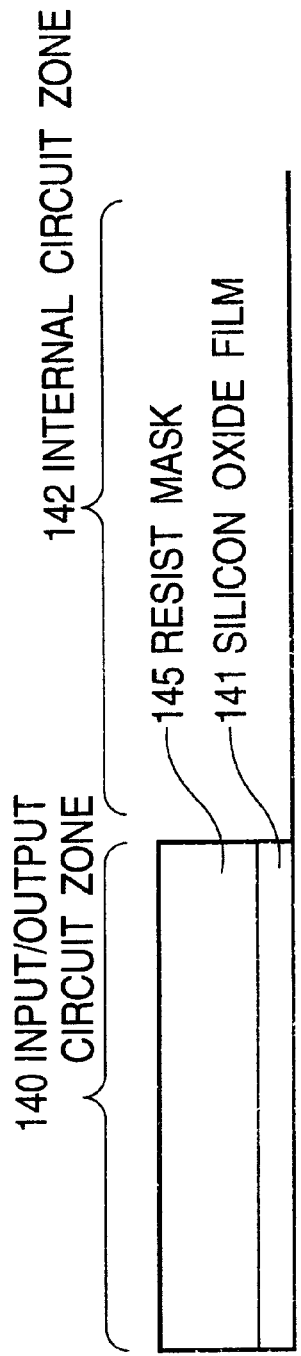
Figure 19B:
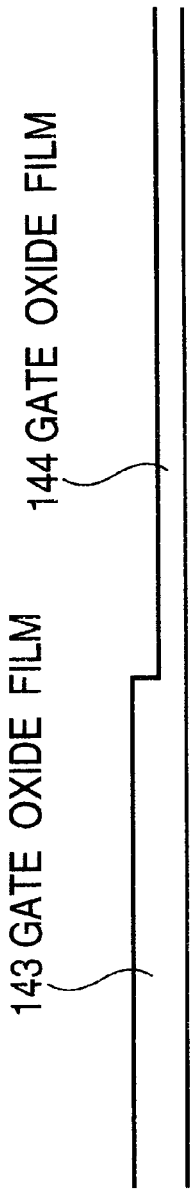

After the polysilicon film 37 is deposited, the polysilicon film 37 is patterned to form gate electrodes 25, 26, 27, 28 and 29 as shown in FIG. 14, similarly to the first embodiment. Furthermore, an n$^+$ diffused layer and a p$^+$ diffused layer are selectively formed, and a memory cell capacitor 3 is formed. Thus, the DRAM of the third embodiment is manufactured.

Advantages of the third embodiment will be described in the following:

First, the advantage of the fact that the third embodiment has a triple well structure, will be described. In the third embodiment, the P-well 10 of the memory cell zone 30, the P-well 14 of the peripheral circuit zone 31, and the P-well 16 of the input/output circuit zone 32 and are electrically isolated from each other by means of the N-wells 13, 63 and 15 and the buried N-type layers 61 and 62.

Accordingly, even if a negative voltage is applied to the n$^+$diffused layer within the P-well 16 of the input/output circuit zone 32 so that electrons are emitted into the P-well 16, these electrons are absorbed by the surrounding N-well 15 and the buried N-type layer 62, with the result that no influence is given to the memory cell zone 30. In addition, electric noises in the peripheral circuit zone 31 and in the input/output circuit zone 32 never propagate to the P-well 10 of the memory cell zone 30. Furthermore, it is possible to set a potential Vbb of the P-well 10 of the memory cell zone 30 to −1V and to set the potential of the P-well 14 of the peripheral circuit zone 31 and the P-well 16 of the input/output circuit zone 32 to a ground potential.

Next, the advantage obtained by having two different gate oxide film thicknesses will be described.

In this third embodiment, it is considered that the internal power supply voltage Vint is 2V and the elevated voltage of the word line is 3.5V. The gates in the memory cell zone 30 are applied with the word line elevated voltage of 3.5V, but since the gage oxide film has the film thickness of 70 Å, an electric field in the gate oxide film becomes 5 MeV/cm, and therefore, reliability of the gate oxide film can be ensured. In the peripheral circuit zone 31 in which the gate is applied with the internal power supply voltage Vint of 2V, the gate oxide films has the film thickness of 55 Å which is smaller than that in the memory cell zone 30, and the ON current correspondingly becomes large. Comparing with a case in which only the one kind of gate oxide film thickness is used so that the gate oxide film having the film thickness of 70 Å is used in all the zones within the chip, the ON current of the MOSFET transistor in the peripheral circuit zone 31 increases by about 27%, similarly to the first embodiment. As a result, the operation speed is elevated.

In addition to the above mentioned advantages, the third embodiment is formed by using the P-type silicon substrate 60. Generally, the P-type silicon substrate is more inexpensive than the N-type silicon substrate. Therefore, the third embodiment can further reduce the cost, in comparison with the first embodiment using the N-type silicon substrate. In the third embodiment, therefore, the triple well structure DRAM having a reduced power consumption and a high speed operation can be realized with a low cost.

As seen from the above, according to the present invention, it is possible to manufacture a semiconductor integrated circuit of the triple well structure having MOS transistors having different gate oxide film thicknesses in a single chip, without increasing the number of steps in the manufacturing process. Therefore, it is possible to manufacture the triple well structure DRAM having a reduced power consumption and a high speed operation with a low cost.

The invention has thus been shown and described with reference to the specific embodiments. However, it should be noted that the present invention is in no way limited to the details of the illustrated structures but changes and modifications may be made within the scope of the appended claims.

What is claimed is:

1. A method for manufacturing a semiconductor integrated circuit of triple well structure, comprising the steps of forming an N-well, a P-well and a device isolation region in an N-type silicon substrate, thereafter forming a silicon oxide film on the whole surface of said silicon substrate by a thermal oxidation, forming a resist mask covering a region in which said silicon oxide film is required, ion-implanting a P-type impurity using said resist mask as a mask and with an implantation energy enough to allow the ion-implanted impurity to reach a bottom of said N-well and said P-well, so as to form a P-type buried impurity layer, thereafter removing said silicon oxide film not covered with said resist mask by an etching, then removing said resist mask, and conducting a thermal oxidation on the whole surface of said silicon substrate so that a relatively thick gate oxide film is formed on a region which was covered with said resist mask, and a relatively thin gate oxide film is formed on a region which was not covered with said resist mask, and thereafter, forming a gate electrode and a source/drain diffused layer in a required well.

2. A method claimed in claim 1 wherein said region which was covered with said resist mask includes an input/output circuit zone in which an external power supply voltage is applied to a gate of a MOS transistor formed in the circuit zone, and a memory cell array zone of a DRAM in which an elevated voltage is applied to a word line, wherein said elevated voltage is higher than an internal voltage applied to a bit line.

3. A method claimed in claim 2, wherein a selected N-well is surrounded by said P-well and said P-type layer formed by the ion-implantation of said P-type impurity, so that said selected N-well is electrically isolated from said N-type silicon substrate.

4. A method claimed in claim 1 wherein a selected N-well is surrounded by said P-well and said buried P-type layer formed by said ion-implantation of said P-type impurity, so that said selected N-well is electrically isolated from said N-type silicon substrate.

5. A method for manufacturing a semiconductor integrated circuit of triple well structure, comprising the steps of forming an N-well, a P-well and a device isolation region in a P-type silicon substrate, thereafter forming a silicon oxide film on the whole surface of said silicon substrate by a thermal oxidation, forming a resist mask covering a region in which said silicon oxide film is required, ion-implanting an N-type impurity using said resist mask as a mask and with an implantation energy enough to allow the ion-implanted impurity to reach a bottom of said N-well and said P-well, so as to form an N-type buried impurity layer, thereafter removing said silicon oxide film not covered with said resist mask by an etching, then removing said resist mask, and conducting a thermal oxidation on the whole surface of said silicon substrate so that a relatively thick gate oxide film is formed on a region which was covered with said resist mask, and a relatively thin gate oxide film is formed on a region which was not covered with said resist mask, and thereafter, forming a gate electrode and a source/drain diffused layer in a required well.

6. A method claimed in claim 5 wherein said region which was covered with said resist mask includes an input/output circuit zone in which an external power supply voltage is applied to a gate of a MOS transistor formed in the circuit zone, and a memory cell array zone of a DRAM in which an elevated voltage is applied to a word line, wherein said elevated voltage is higher than an internal voltage applied to a bit line.

7. A method claimed in claim 6 wherein a selected P-well is surrounded by said N-well and said buried N-type layer formed by the ion-implantation of said N-type impurity, so that said selected P-well is electrically isolated from said P-type silicon substrate.

8. A method claimed in claim 5 wherein a selected P-well is surrounded by said N-well and said buried N-type layer formed by the ion-implantation of said N-type impurity, so that said selected P-well is electrically isolated from said P-type silicon substrate.

9. A method for manufacturing a semiconductor integrated circuit of triple well structure, the method comprising:

forming at least two wells having different conductivities in a substrate;

forming an oxide film on the surface of the substrate;

ion-implanting an impurity directly beneath the at least two wells having different conductivities;

removing a portion of the oxide film from a first region of the substrate located above the ion-implanted impurity and the at least two wells;

forming a relatively thin gate oxide film on the first region of the substrate; and forming a relatively thick gate oxide film on a second region of the substrate, wherein the second region is located in an area other than above the ion-implanted impurity and the at least two wells.

* * * * *